(12) United States Patent
Hung et al.

(10) Patent No.: US 9,559,493 B2
(45) Date of Patent: Jan. 31, 2017

(54) POWER MONITORING DEVICE AND TRANSMITTER HAVING SAME

(71) Applicant: SAE Magnetics (H.K.) Ltd., Hong Kong (HK)

(72) Inventors: Vincent Wai Hung, Hong Kong (HK); Wei Ma, Hong Kong (HK); Xiaoming Yu, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 76 days.

(21) Appl. No.: 14/733,990

(22) Filed: Jun. 9, 2015

(65) Prior Publication Data

US 2016/0365703 A1 Dec. 15, 2016

(51) Int. Cl.

| | | |
|---|---|---|
| *H04B 10/564* | (2013.01) | |
| *H04B 10/079* | (2013.01) | |
| *H04B 10/50* | (2013.01) | |
| *H01S 5/068* | (2006.01) | |
| *H01S 5/022* | (2006.01) | |
| *H01S 5/042* | (2006.01) | |
| *H01S 5/0683* | (2006.01) | |
| *H01S 5/183* | (2006.01) | |
| *H01S 5/42* | (2006.01) | |
| *H01L 31/105* | (2006.01) | |
| *H01S 5/00* | (2006.01) | |

(52) U.S. Cl.
CPC ....... *H01S 5/06808* (2013.01); *H01L 31/1055* (2013.01); *H01S 5/005* (2013.01); *H01S 5/02248* (2013.01); *H01S 5/02276* (2013.01); *H01S 5/042* (2013.01); *H01S 5/0425* (2013.01); *H01S 5/0683* (2013.01); *H01S 5/183* (2013.01); *H01S 5/423* (2013.01); *H04B 10/07955* (2013.01); *H04B 10/503* (2013.01); *H04B 10/564* (2013.01)

(58) Field of Classification Search
None
See application file for complete search history.

(56) References Cited

U.S. PATENT DOCUMENTS

| | | | |
|---|---|---|---|
| 5,475,701 A | | 12/1995 | Hibbs-Brenner |
| 5,491,712 A | | 2/1996 | Lin et al. |
| 5,566,265 A | * | 10/1996 | Spaeth ............... G02B 6/29361 385/93 |
| 6,037,644 A | * | 3/2000 | Daghighian ........ H01L 31/1016 257/431 |
| 6,081,638 A | | 6/2000 | Zhou |
| 6,678,292 B2 | | 1/2004 | Wickstom et al. |
| 6,792,178 B1 | | 9/2004 | Zhou |

(Continued)

FOREIGN PATENT DOCUMENTS

TW 200832851 A 8/2008

*Primary Examiner* — Darren E Wolf

(57) ABSTRACT

A power monitoring device includes: a silicon support layer being attached to a PCB board; a glass layer disposed above the silicon support layer; at least one sensing element disposed on the glass layer; and at least one metal pad disposed on the glass layer. The sensing element is suspended over a laser element that is attached to the PCB board and configured for sensing light directed thereto that is emitted by the laser element. A cavity is defined in the silicon support layer and configured for accommodating the laser element. A transmitter that includes the power monitoring device is also provided.

20 Claims, 23 Drawing Sheets

(56) References Cited

U.S. PATENT DOCUMENTS

| | | |
|---|---|---|
| 6,895,147 B2 | 5/2005 | Posamentier |
| 7,264,408 B2 | 9/2007 | Togami et al. |
| 7,961,770 B1 | 6/2011 | Zhu et al. |
| 8,000,358 B2 | 8/2011 | Wang |
| 8,705,975 B2 | 4/2014 | Chen et al. |
| 2008/0008512 A1 | 1/2008 | Hawryschuk et al. |
| 2013/0156418 A1 | 6/2013 | Stapleton et al. |
| 2016/0093595 A1* | 3/2016 | Parsa .................. H01L 31/109 257/82 |

* cited by examiner

POWER MONITORING DEVICE AND TRANSMITTER HAVING SAME

FIELD OF THE PATENT APPLICATION

The present patent application generally relates to optoelectronics and more specifically to a power monitoring device and a transmitter having the same.

BACKGROUND

Vertical cavity surface emitting laser (VCSEL) has many advantages over edge emitting lasers, such as a simple manufacture process, a single mode as well as multi-mode of operation, high coupling efficiency and lower cost, and etc. So it is widely used in a variety of optical fiber communication system. The VCSELs, indeed a semiconductor laser in general, has the nature that the optical output taken as a function of input current represents a steep slope during lasing action. Hence, during its operations in optoelectronic transmitters, minor variations, e.g. ambient temperature changes and aging of the device, can result in significant fluctuations in its output power. In order to ensure a near constant output power from the VCSEL, a feedback control system is desired, that first requires a monitoring system to detect its optical output. Usually photo detectors are used in this kind of application, with the form of either being integrated into the VCSEL structure or standing alone separately from it.

Integrating monitoring photo detector with VCSEL can only be realized during VCSEL fabrication. More fabrication steps have to be introduced during VCSEL formation and VCSEL normal manufacture process has to be interrupted. That increases the process complicity and the risk for VCSEL yield. It is obvious that these drawbacks can be easily overcome by a stand-alone photo detector; the main consideration can be simplified on how to integrate the detector with VCSEL by packaging.

Packaging the monitoring photo detector with VCSEL together is widely investigated in recent years. Due to that light emitting of a typical VCSEL only comes from one surface of its structure, any monitoring should use the same output for optical communication. Approaches focus on detecting a partial reflection of the output power, which requires a specific assemble position among VCSEL, monitoring photo detector and reflecting system.

To ensure reliable performance of the optical transmitter, it is therefore desired to provide a low cost and non-interfering VCSEL power monitoring system, which can integrate VCSEL with reduced complexity and increased manufacturability.

SUMMARY

The present patent application is directed to a power monitoring device and a transmitter having the same. In one aspect, the power monitoring device that includes: a silicon support layer being attached to a PCB board; a glass layer disposed above the silicon support layer; at least one sensing element disposed on the glass layer; and at least one metal pad disposed on the glass layer. The sensing element is suspended over a laser element that is attached to the PCB board and configured for sensing light directed thereto that is emitted by the laser element. The silicon support layer includes a cavity configured for accommodating the laser element.

The at least one sensing element may be a PIN photodiode including a p-type amorphous silicon layer, an n-type amorphous silicon layer, and an intrinsic silicon layer disposed in between the p-type amorphous silicon layer and the n-type amorphous silicon layer. The transmitter may further include a transparent electrode layer buried between the sensing element and the glass layer, and a contact electrode layer disposed on the sensing element.

The transparent electrode layer may be made of ITO. The power monitoring device may further include an antireflection layer disposed underneath the glass layer. The sensing element may have a rectangular shape, and cover a predetermined percentage of a light distribution emitted from an aperture of the laser element.

The power monitoring device may include a plurality of sensing elements, the sensing elements each having a rectangular shape, being distributed symmetrically or asymmetrically, and covering an edge portion of a light distribution emitted from an aperture of the laser element.

The sensing element may have a ring shape, and cover an edge portion or an inner portion of a light distribution emitted from an aperture of the laser element.

In another aspect, the present patent application provides a transmitter that includes: a PCB board; a laser element disposed on the PCB board and attached thereto; a power monitoring device disposed on the PCB board above the laser element and attached to the PCB board; a lens part disposed on the PCB board and above the laser element and the power monitoring device; an IC driver disposed on the PCB board and connected with the laser element through bond wires; and a feedback circuit for the IC driver connected with the power monitoring device through a plurality of bond wires. The power monitoring device includes a silicon support layer being attached to the PCB board, a glass layer disposed above the silicon support layer, at least one sensing element disposed on the glass layer, and at least one metal pad disposed on the glass layer. The sensing element is suspended over the laser element and configured for sensing light directed thereto that is emitted by the laser element. The silicon support layer includes a cavity configured for accommodating the laser element.

The laser element may include a VCSEL or a VCSEL array. The at least one sensing element may be a PIN photodiode including a p-type amorphous silicon layer, an n-type amorphous silicon layer, and an intrinsic silicon layer disposed in between the p-type amorphous silicon layer and the n-type amorphous silicon layer. The transmitter may further include a transparent electrode layer buried between the sensing element and the glass layer, and a contact electrode layer disposed on the sensing element. The transparent electrode layer may be made of ITO.

The power monitoring device may further include an antireflection layer disposed underneath the glass layer. The sensing element may have a rectangular shape, and cover a predetermined percentage of a light distribution emitted from an aperture of the laser element.

The power monitoring device may include a plurality of sensing elements, the sensing elements each having a rectangular shape, being distributed symmetrically or asymmetrically, and covering an edge portion of a light distribution emitted from an aperture of the laser element.

The sensing element may have a ring shape, and cover an edge portion or an inner portion of a light distribution emitted from an aperture of the laser element. The sensing element may have a circular shape, and cover a center portion of a light distribution emitted from an aperture of the laser element. A slant side wall may be formed in the silicon support layer so as to define the cavity for accommodating the laser element.

In yet another aspect, the present patent application provides a transmitter that includes: a PCB board; a laser element disposed on the PCB board; a power monitoring device disposed on the PCB board above the laser element; and a lens part disposed on the PCB board and above the laser element and the power monitoring device. The power monitoring device includes a silicon support layer being attached to the PCB board, a glass layer disposed above the silicon support layer, at least one sensing element disposed on the glass layer, and at least one metal pad disposed on the glass layer. The sensing element is suspended over the laser element and configured for sensing light directed thereto that is emitted by the laser element. The silicon support layer includes a cavity configured for accommodating the laser element.

The sensing element may have a circular shape, and cover a center portion of a light distribution emitted from an aperture of the laser element. A slant side wall may be formed in the silicon support layer so as to define the cavity for accommodating the laser element.

DETAILED DESCRIPTION

Reference will now be made in detail to a preferred embodiment of the power monitoring device and the transmitter having the same disclosed in the present patent application, examples of which are also provided in the following description. Exemplary embodiments of the power monitoring device and the transmitter having the same disclosed in the present patent application are described in detail, although it will be apparent to those skilled in the relevant art that some features that are not particularly important to an understanding of the power monitoring device and the transmitter having the same may not be shown for the sake of clarity.

Furthermore, it should be understood that the power monitoring device and the transmitter having the same disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
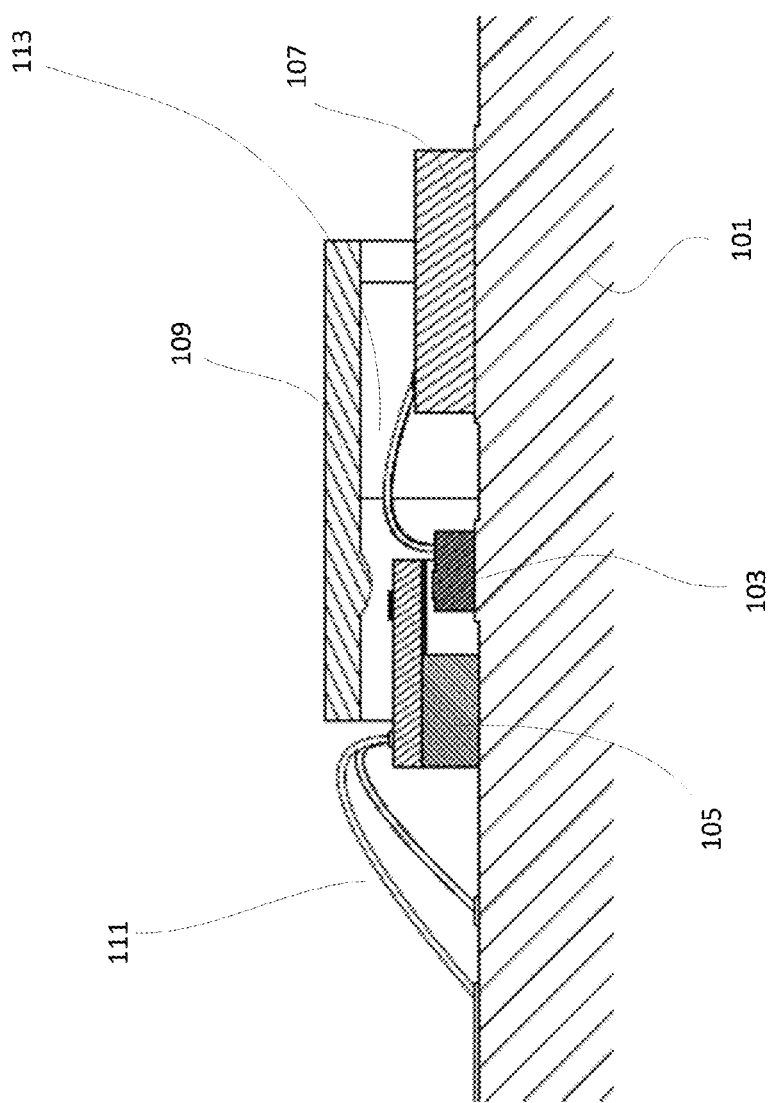
FIG. 1 is a cross-sectional view of a transmitter with a power monitoring device in accordance with an embodiment of the present patent application.
Figure 2A:
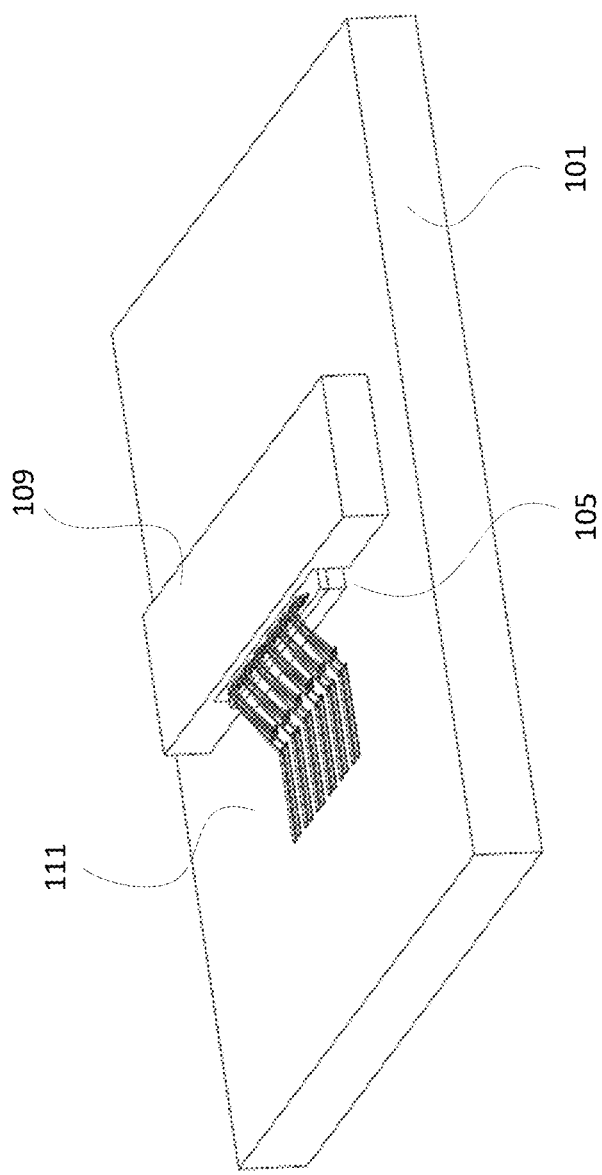
FIG. 2A is a perspective view of the transmitter with a power monitoring device depicted in FIG. 1.
Figure 2B:
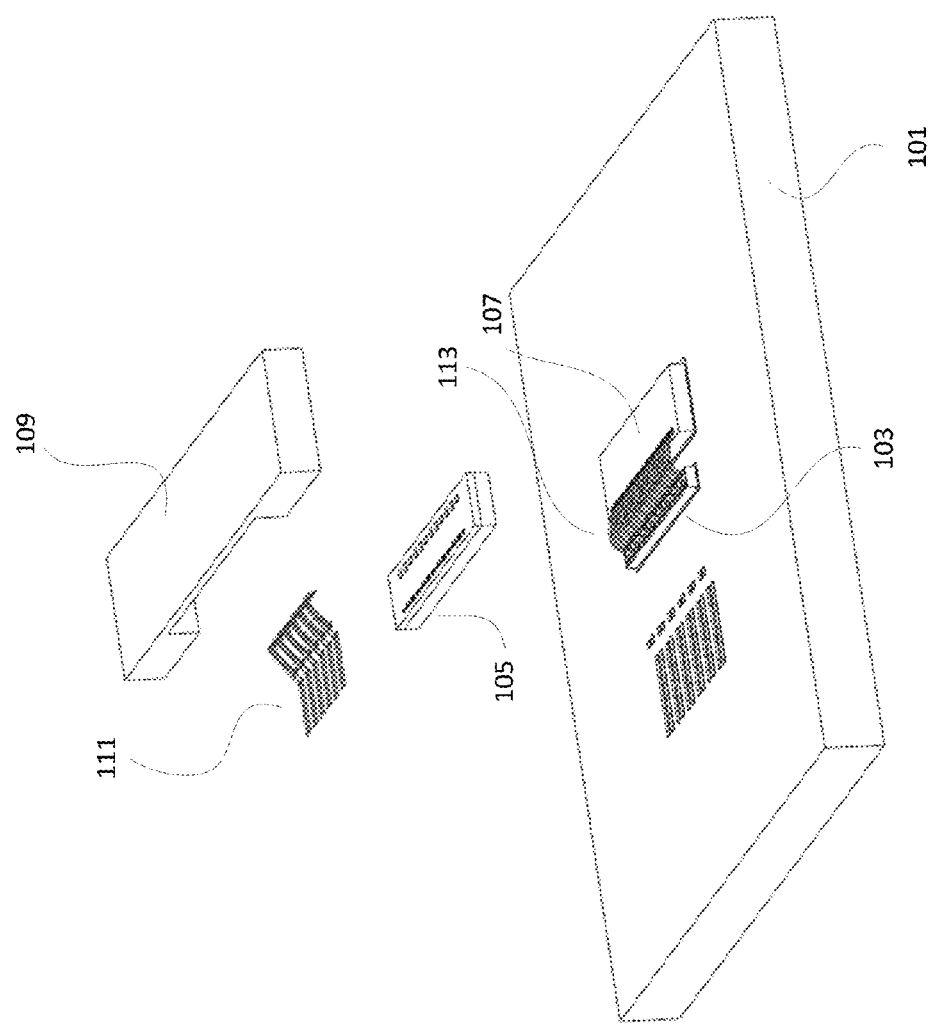
FIG. 2B is an exploded view of the transmitter with a power monitoring device depicted in FIG. 1.

FIG. 1 is a cross-sectional view of a transmitter with a power monitoring device in accordance with an embodiment of the present patent application. FIG. 2A is a perspective view of the transmitter with a power monitoring device depicted in FIG. 1. FIG. 2B is an exploded view of the transmitter with a power monitoring device depicted in FIG. 1. Referring to FIGS. 1, 2A and 2B, the transmitter includes a PCB board 101, a laser element 103, a power monitoring device 105, and a lens part 109. The laser element 103, the power monitoring device 105, and the lens part 109 are disposed on the PCB board 101 and attached thereto. The lens part 109 which can ensure the light from laser element 103 to be collimated and directed to the optical fiber is disposed above the laser element 103 as the usual transmitter design, as well as the power monitoring device 105 which is disclosed in the present patent application. To describe it in another point of view, the power monitoring device 105 is disposed above the laser element 103 as well as under the lens part 109 so that light emitted from the laser element 103 passes through the power monitoring device 105 and is received by the lens part 109. The transmitter further includes an IC driver 107 disposed on the PCB board 101 and connected with the laser element 103 through bond wires 113. The power monitoring device 105 is connected to a feedback circuit for the IC driver 107 through a plurality of bond wires 111. In this embodiment, the laser element 103 includes a VCSEL or a VCSEL array.

Figure 3A:
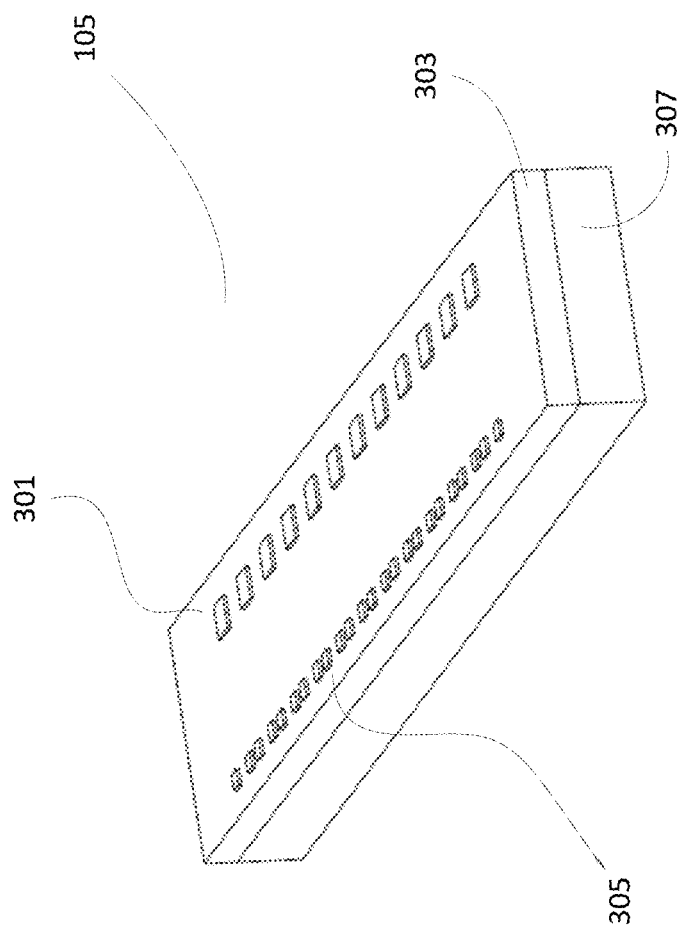
FIG. 3A is a perspective view of a power monitoring device in accordance with an embodiment of the present patent application.
Figure 3B:
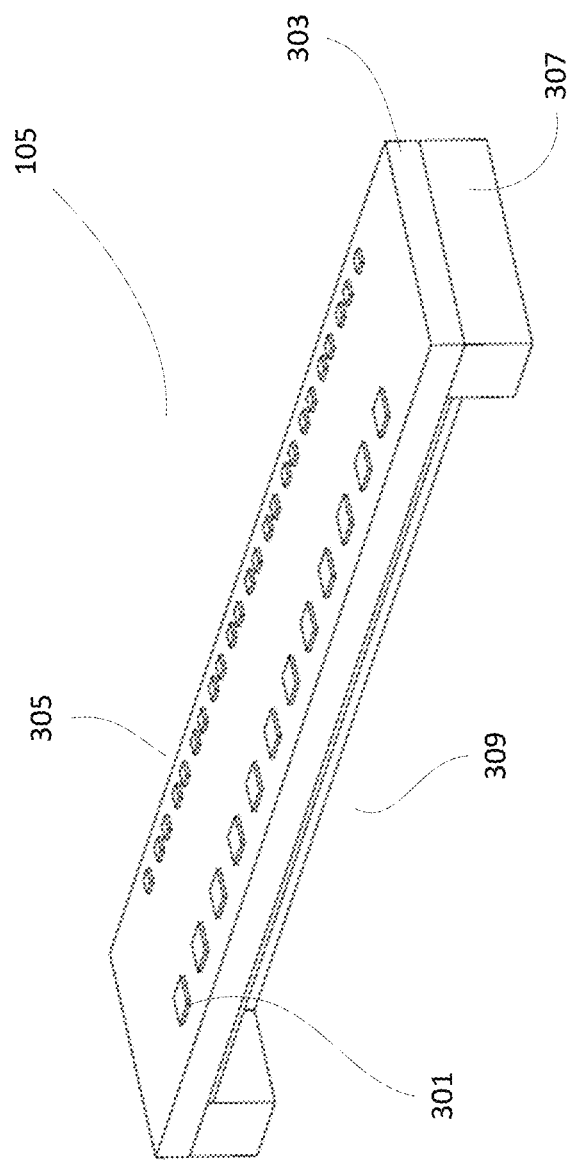
FIG. 3B is another perspective view of the power monitoring device depicted in FIG. 3A.

FIG. 3A is a perspective view of the power monitoring device 105 in accordance with an embodiment of the present patent application. FIG. 3B is another perspective view of the power monitoring device 105 depicted in FIG. 3A. Referring to FIG. 3A and FIG. 3B, the power monitoring device 105 includes a silicon support layer 307 being attached to the PCB board 101 (in FIG. 2B), a glass layer 303 disposed above the silicon support layer 307, at least one sensing element 301, being a PIN photodiode in this embodiment, and at least one metal pad 305. In this embodiment, the power monitoring device 105 includes a plurality of sensing elements 301 and a plurality of metal pads 305. Both the sensing elements 301 and the metal pads 305 are disposed on the glass layer 303. Referring to FIG. 3B and FIG. 1, a cavity 309 is defined in the silicon support layer 307 and configured for accommodating the laser element 103. That made the sensing elements 301 on the glass layer 303 are suspended over the laser element 103 (in FIG. 1) and configured for sensing light directed thereto that is emitted by the laser element 103.

In this embodiment, the glass layer 303 has a thickness in the range of 100 to 200 um. The silicon support layer 307 has a thickness in the range of 200 to 400 um. A plurality of metal traces may be disposed on the glass layer 303 and in electrical connection with the metal pads 305.

Figure 4:
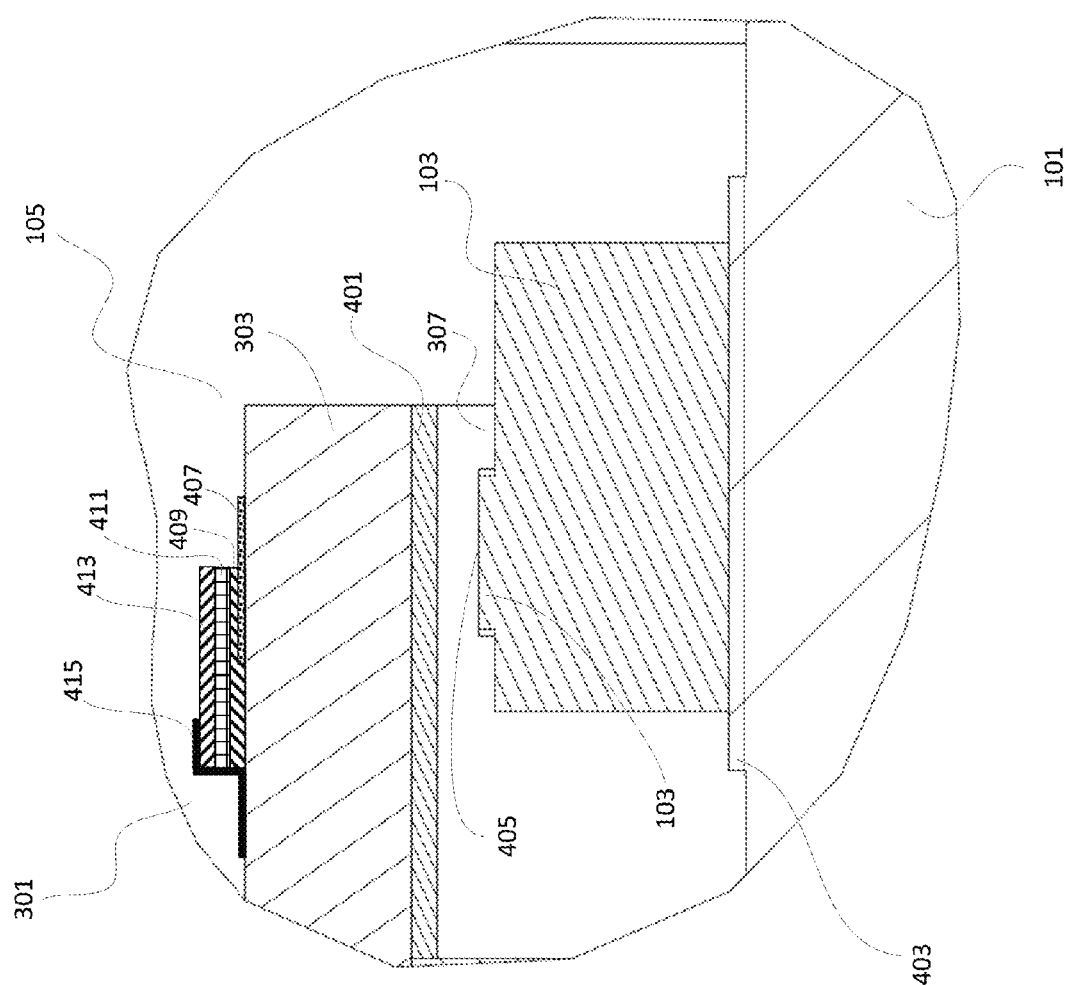
FIG. 4 is a partial enlarged cross-sectional view of the transmitter depicted in FIG. 1.

FIG. 4 is a partial enlarged cross-sectional view of the transmitter depicted in FIG. 1. Referring to FIG. 4, each sensing element 301, which is a PIN photodiode, includes a p-type amorphous silicon layer 409, an intrinsic silicon layer 411, and an n-type amorphous silicon layer 413 disposed in sequence. In this embodiment, the sequence is the p-type amorphous silicon layer 409, the intrinsic silicon layer 411 and the n-type amorphous silicon layer 413 upwards as shown in FIG. 4. In an alternative embodiment, the sequence may be arranged downwards. In other words, the p-type amorphous silicon layer 409 and the n-type amorphous silicon layer 413 as shown in FIG. 4 may be exchanged in position, while the intrinsic silicon layer 411 remains to be disposed in between the p-type amorphous silicon layer 409 and the n-type amorphous silicon layer 413. In this embodiment, the transmitter further includes a transparent electrode layer 407 buried between the sensing element 301 and the glass layer 303, and a contact electrode layer 415 disposed on the sensing element 301. In this embodiment, Indium tin oxide (ITO) is used as the transparent electrode layer 407. The criteria of the material selection is their absorption and reflect rate toward the wavelength coming from laser element is low, and the material behaves almost transparent. If the sensing element area is tailored to absorb only small part of the light power yet still sufficient for sensing, it can act as a non-interfering monitor. In this embodiment, the ITO layer 407 has a thickness of 0.2 to 0.5 um. The p-type amorphous silicon layer 409 and the n-type amorphous silicon layer 413 respectively have a thickness of 0.2 to 0.5 um. The intrinsic silicon layer 411 has a thickness of 1 to 2 um. The contact electrode layer 415 may be made of (Ti, TiW)/(Au, Cu), Al, Mo, etc.

Referring to FIG. 4, the aperture of the laser element 103 is located at the position 405 so that light output from the aperture by the laser element can be sampled by the at least one sensing element 301. In this embodiment, the power monitoring device further includes an antireflection layer 401 disposed underneath the glass layer 303 to prevent the light reflected by sensing element 301 from coming into the aperture of the laser element 103 in order to avoid cross interference. The antireflection layer 401 has a thickness less than 1 um. At least a metal pad 403 may be disposed between the laser element 103 and the PCB board 101.

Figure 5:
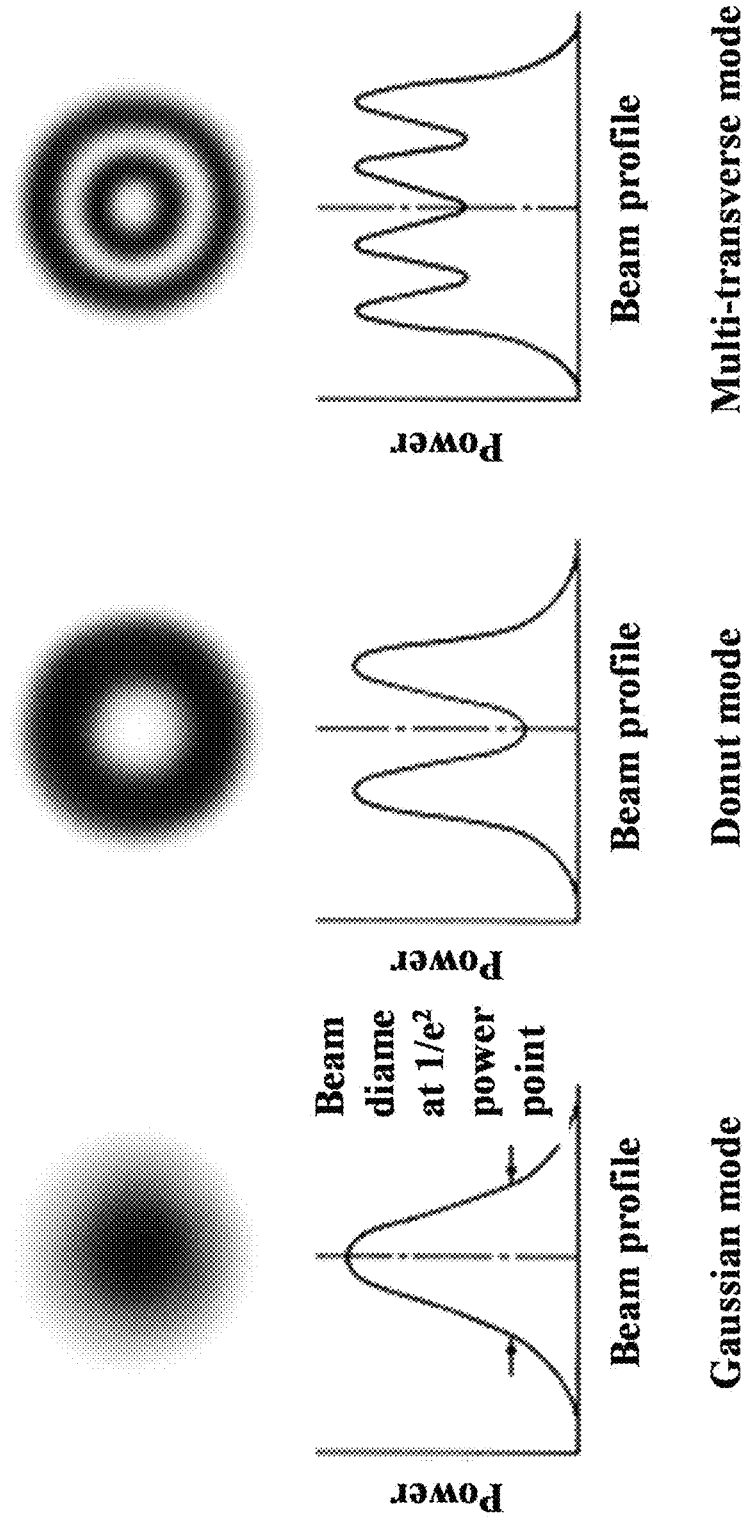
FIG. 5 illustrates three typical light distribution modes for a VCSEL beam.

FIG. 5 illustrates three typical light distribution modes for a VCSEL beam. In this embodiment, the tailored sensing elements 103 are configured to occupy an area, which makes the sensing elements 103 not affect the major power of the VCSEL that passes through. For example, the area may start from the positions where the power drops down to a $1/e^2$ point. The power monitoring device is calibrated by projecting the whole power of VCSEL before its first usage. With the calibration value as a reference point, variations of the VCSEL power during usage can be monitored.

Figure 6A:
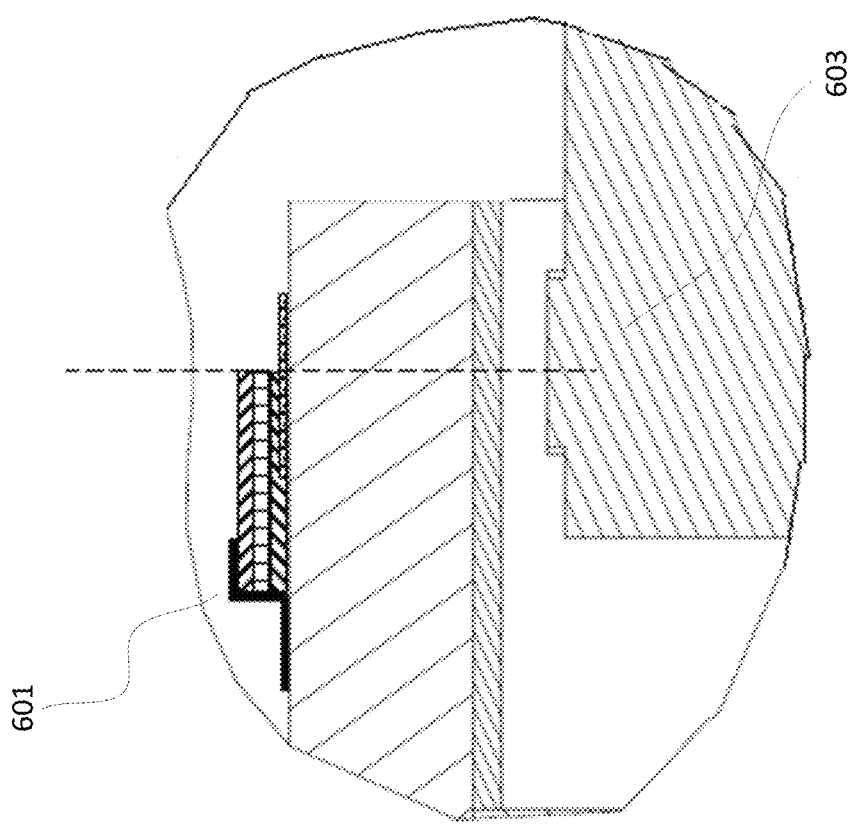
FIG. 6A illustrates an alignment between a sensing element and a laser element in a transmitter with a monitoring device in accordance with an embodiment of the present patent application.

The sensing element may only occupy partial area of the VCSEL aperture. FIG. 6A illustrates an alignment between a sensing element and a laser element in a transmitter with a monitoring device in accordance with an embodiment of the present patent application. Referring to FIG. 6A, the sensing element 601 is of a sheet type and is configured to cover half (or other percentage) of the aperture area of the VCSEL (the laser element 603).

Figure 6B:
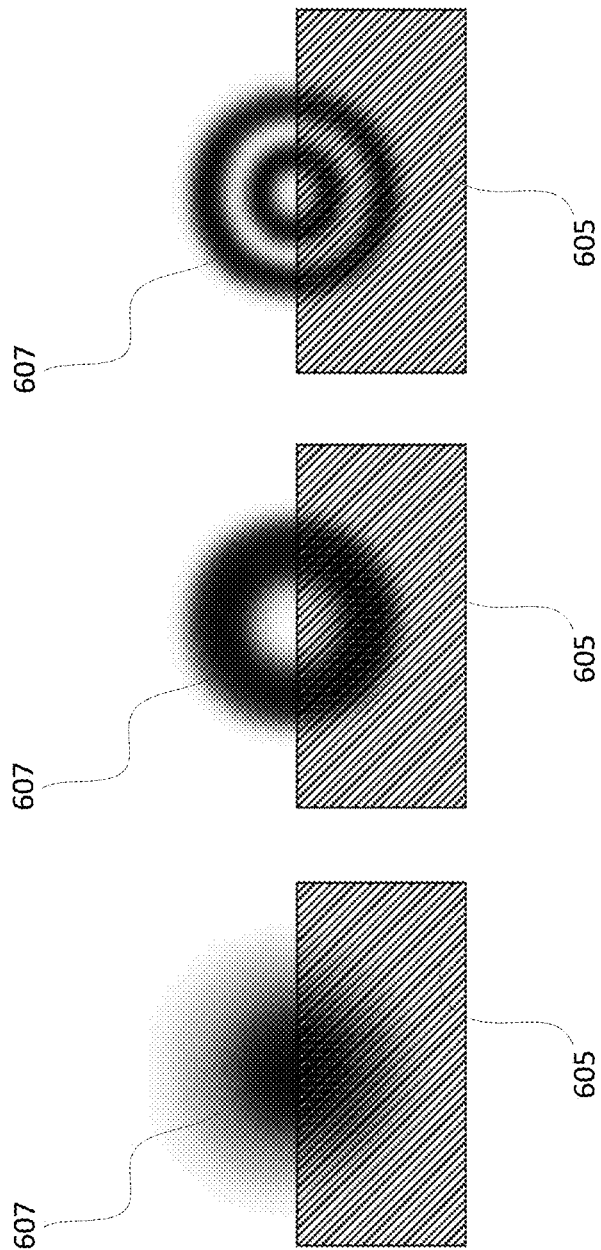
FIG. 6B illustrates the alignment depicted in FIG. 6A is being used for three different light beam modes as depicted in FIG. 5.

FIG. 6B illustrates such type of alignment is being used for three different light beam modes as depicted in FIG. 5. Referring to FIG. 6B, for the three different modes, the sensing element 605 has an essentially rectangular shape. A light distribution 607 emitted from the VCSEL aperture is intercepted by the sensing element 605 partially since the sensing element 605 covers half of the light distribution 607. This directs to a result that clearly half of the light power passes through the glass thoroughly and half of the light power passes through the glass mostly with only a little part sensed by the sensing element 605. It is understood that in other embodiments, the sensing element 605 may cover other percentages of the light distribution 607.

Figure 7:
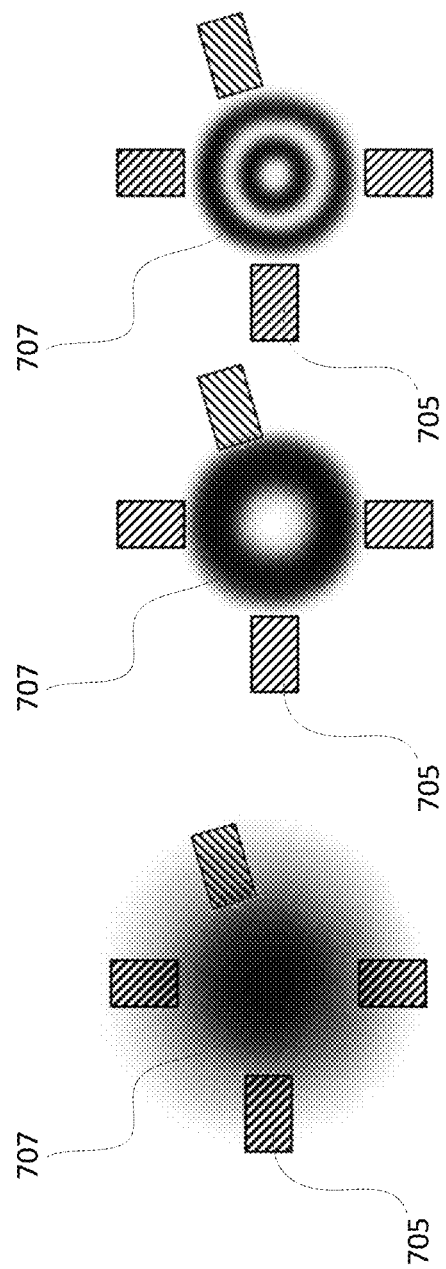
FIG. 7 illustrates an alignment between a plurality of sensing elements and a laser element in a transmitter with a monitoring device in accordance with another embodiment of the present patent application.

FIG. 7 illustrates an alignment between a plurality of sensing elements and a laser element in a transmitter with a monitoring device in accordance with another embodiment of the present patent application. Referring to FIG. 7, for the three different modes depicted in FIG. 5, more than one sensing elements 705, each having an essentially rectangular shape or other suitable shapes, are distributed symmetrically or asymmetrically as the tailored sensing elements, and covering an edge portion of a light distribution 707 emitted from the VCSEL aperture.

Figure 8:
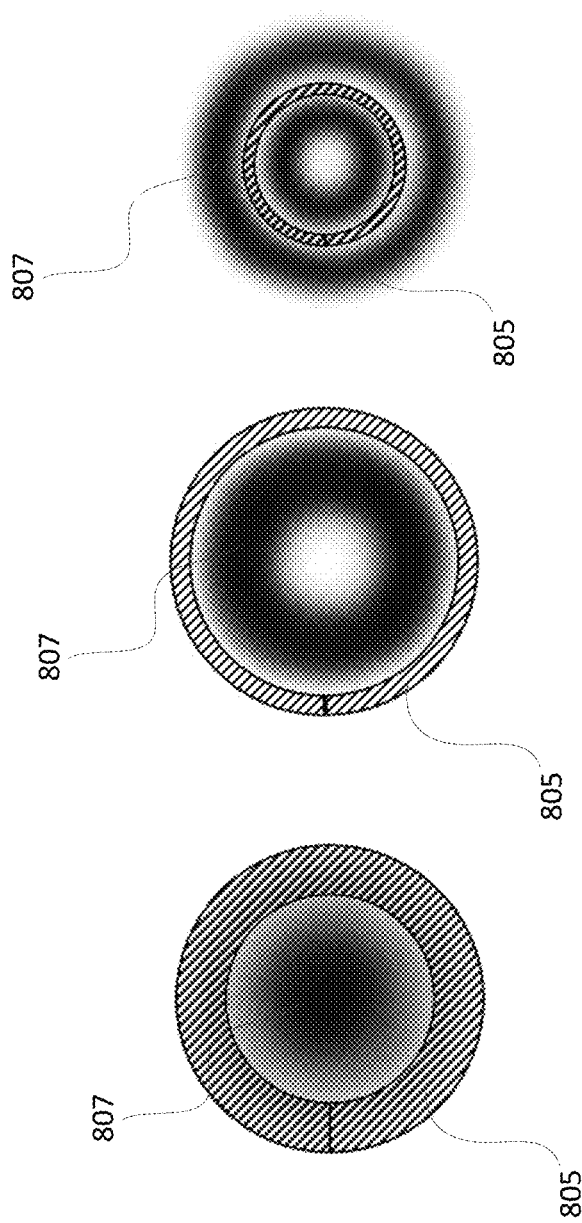
FIG. 8 illustrates an alignment between a sensing element and a laser element in a transmitter with a monitoring device in accordance with yet another embodiment of the present patent application.

FIG. 8 illustrates an alignment between a tailored sensing element and a laser element in a transmitter with a monitoring device in accordance with yet another embodiment of the present patent application. Referring to FIG. 8, for the three different modes depicted in FIG. 5, the sensing element 805, has an essentially ring shape, and covers an edge portion or an inner portion of a light distribution 807 emitted from the VCSEL aperture.

Figure 9:
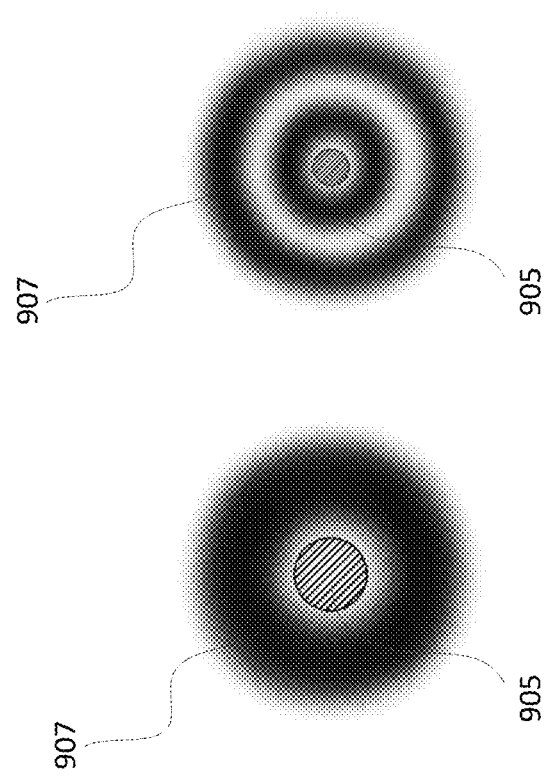
FIG. 9 illustrates an alignment between a sensing element and a laser element in a transmitter with a monitoring device in accordance with still another embodiment of the present patent application.

FIG. 9 illustrates an alignment between a tailored sensing element and a laser element in a transmitter with a monitoring device in accordance with still another embodiment of the present patent application. Referring to FIG. 9, for two different modes depicted in FIG. 5, the sensing element 905 has an essentially circular shape, and covers a center portion of a light distribution 907 emitted from the VCSEL aperture.

Figure 10:
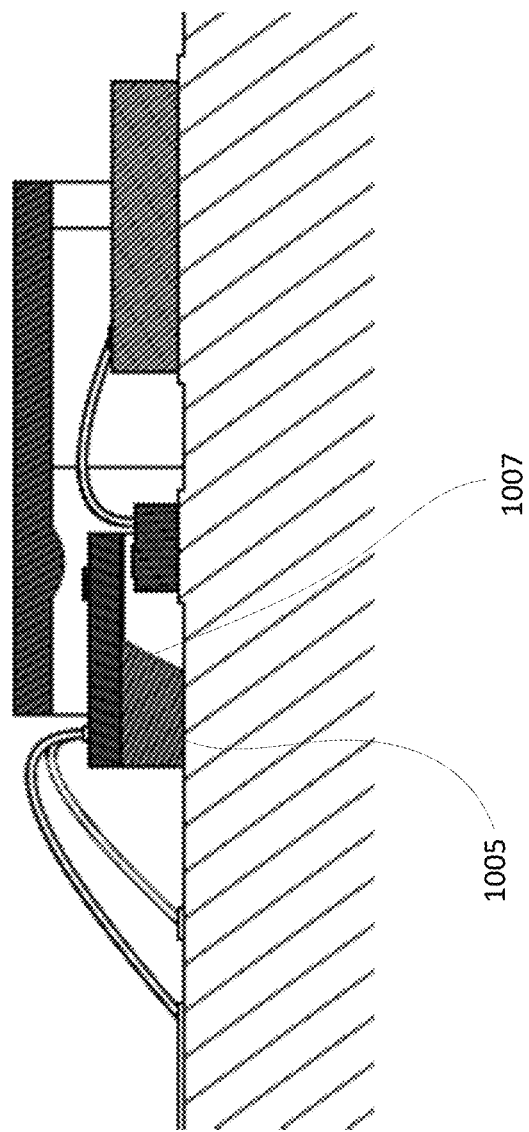
FIG. 10 illustrates is a cross-sectional view of a transmitter with a power monitoring device in accordance with still another embodiment of the present patent application.

FIG. 10 illustrates is a cross-sectional view of a transmitter with a power monitoring device in accordance with still another embodiment of the present patent application. Referring to FIG. 10, in this embodiment, a slant side wall 1007 is formed in the silicon support layer 1005 so as to define the cavity for accommodating the laser element by anisotropic silicon wet etching.

FIGS. 11a-11j are cross-sectional views of a power monitoring device in steps of its manufacturing process in accordance with an embodiment of the present patent application. Process is going in on silicon wafer by batch fabrication process. Due to the power monitoring device structure attribute, a pair of the power monitoring devices can be configured symmetrically sharing the common cavity which accommodates the laser element. This layout arrangement can increase the wafer utility and simplify the process. Two independent devices with the exactly same structure can be achieved by a single dicing process through the symmetrical axis. More than hundreds or even thousands of devices can be fabricated in one wafer.

Figure 11A:
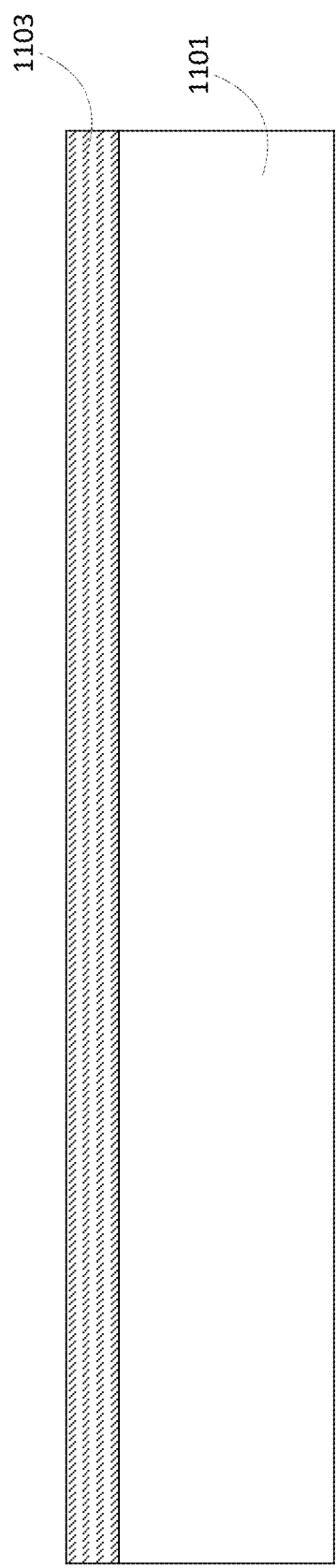
FIG. 11a is a cross-sectional view of a power monitoring device in a step of its manufacturing process in accordance with an embodiment of the present patent application.

Referring to FIG. 11a, a bulk silicon wafer having a thickness of about 400 um and a glass wafer having a thickness of about 400 um are used as starting materials. Anodic bonding is carried out to bond the silicon wafer (referring to the silicon support layer 1101 in FIG. 11a) and the glass wafer (referring to the glass layer 1103 in FIG. 11a). The glass wafer is then grinded to have a thickness of about 100 um.

Figure 11B:
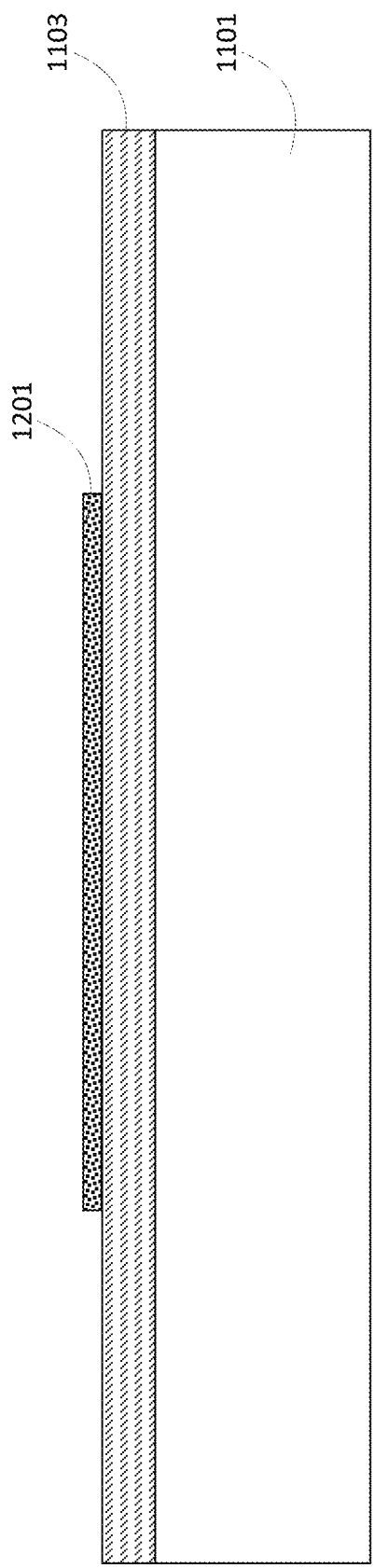
FIG. 11b is a cross-sectional view of a power monitoring device in another step of its manufacturing process in accordance with an embodiment of the present patent application.

FIG. 11b is a cross-sectional view of a power monitoring device in another step of its manufacturing process in accordance with an embodiment of the present patent application. Referring to FIG. 11b, a transparent ITO layer 1201 is deposited on the glass layer 1103. The ITO layer 1201 is about 200 nm to 500 nm thick. After the deposition, the ITO layer 1201 is being patterned into electrodes.

Figure 11C:
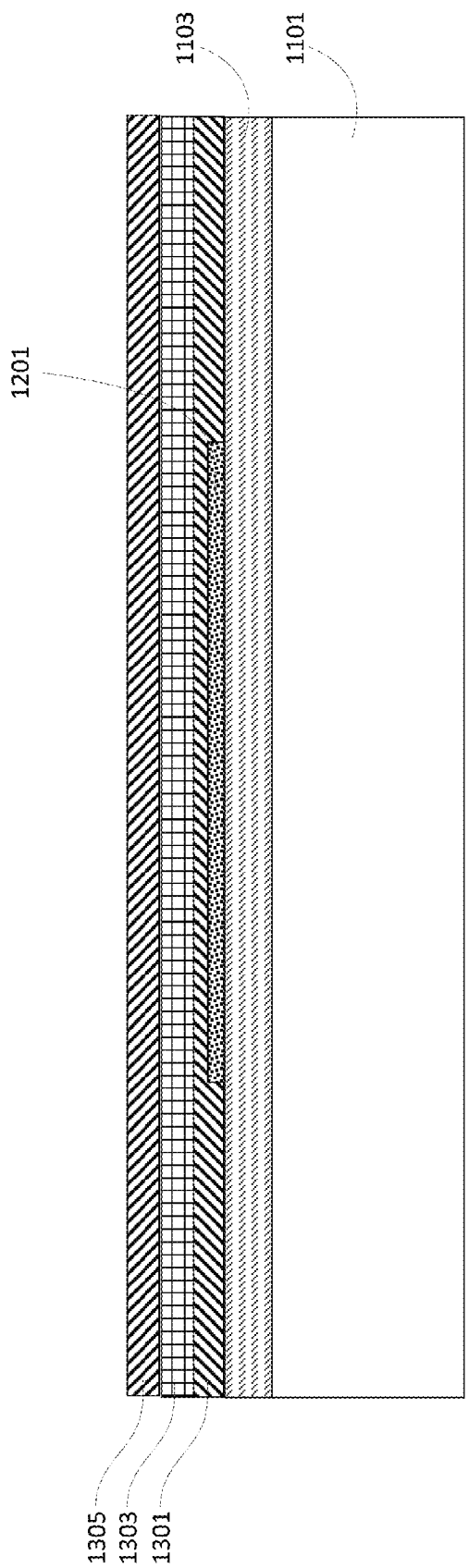
FIG. 11c is a cross-sectional view of a power monitoring device in yet another step of its manufacturing process in accordance with an embodiment of the present patent application.

FIG. 11c is a cross-sectional view of a power monitoring device in yet another step of its manufacturing process in accordance with an embodiment of the present patent application. Referring to FIG. 11c, an amorphous silicon layer 1301, having a thickness of 0.2-0.5 um, is conformally disposed on the glass layer 1103 and the ITO layer 1201 followed by p-type doping or implantation to form p-type amorphous silicon. Then an intrinsic amorphous silicon layer 1303, having a thickness of 1-2 um, is deposited on the p-type amorphous silicon layer 1301. After that, an n-type amorphous silicon layer 1305, having a thickness of 0.2-0.5 um, is formed on the intrinsic silicon layer 1303 by n-type doping or implantation.

Figure 11D:
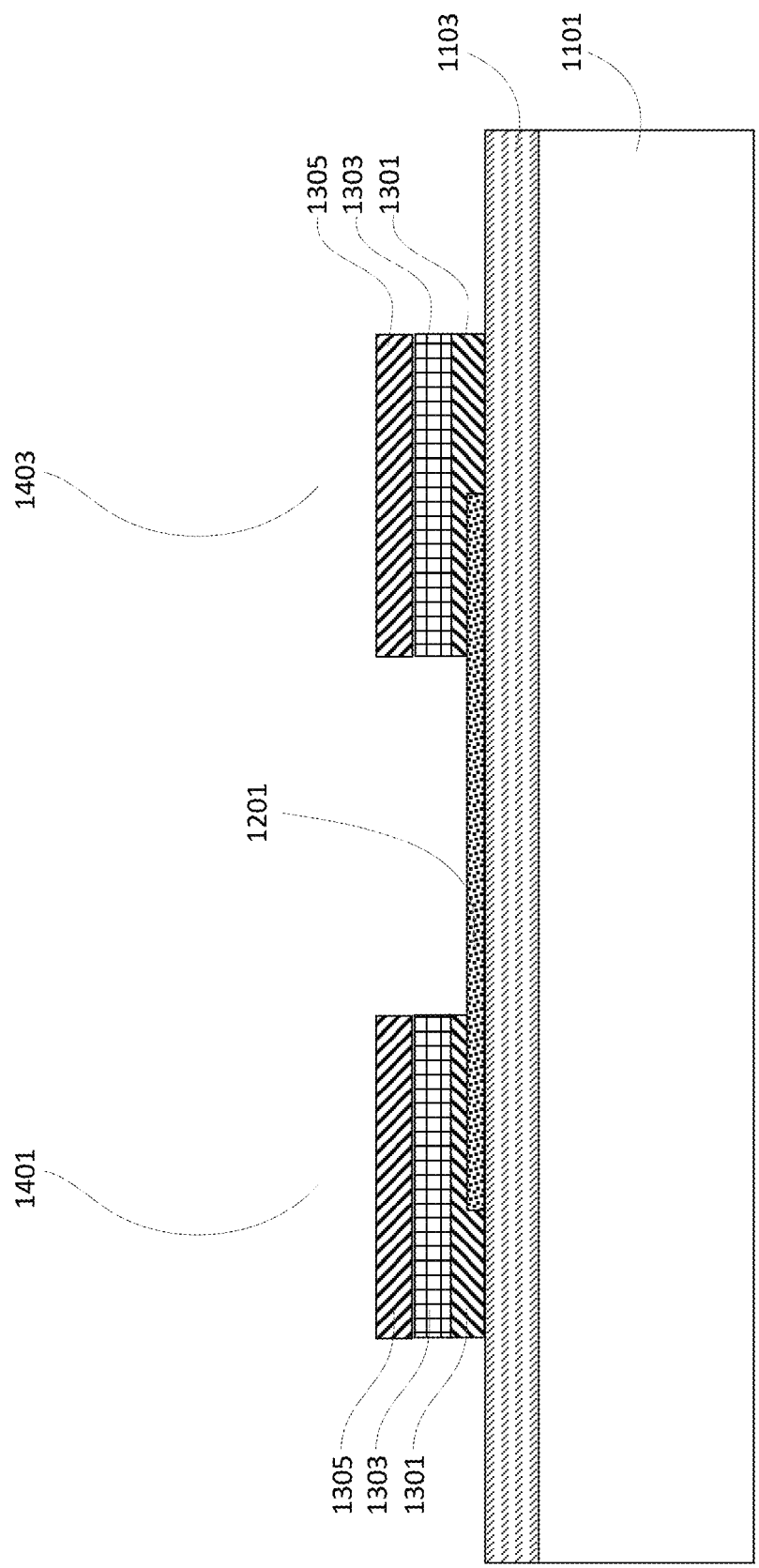
FIG. 11d is a cross-sectional view of a power monitoring device in still another step of its manufacturing process in accordance with an embodiment of the present patent application.

FIG. 11d is a cross-sectional view of a power monitoring device in still another step of its manufacturing process in accordance with an embodiment of the present patent application. Referring to FIG. 11d, RIE dry etching is carried out to form the sensing elements 1401 with tailored configurations disclosed above. It is understood that the power monitoring device in this embodiment includes a plurality of sensing elements patterned this way.

Figure 11E:
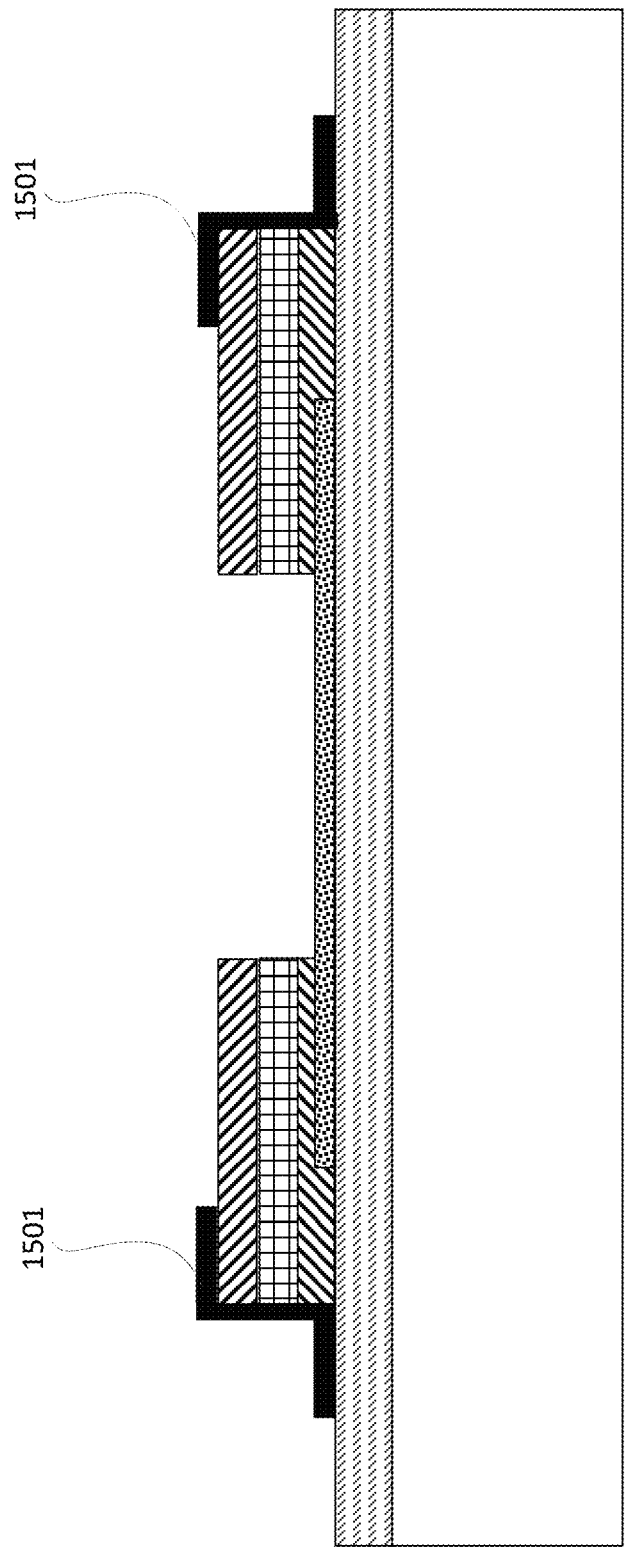
FIG. 11e is a cross-sectional view of a power monitoring device in still another step of its manufacturing process in accordance with an embodiment of the present patent application.

FIG. 11e is a cross-sectional view of a power monitoring device in still another step of its manufacturing process in accordance with an embodiment of the present patent application. Referring to FIG. 11e, metal pad deposition and patterning are carried out so as to form the contact electrode 1501. In this embodiment, the contact electrode may be made of metal such as (Ti, TiW)/(Au, Cu), Al, Mo, and etc.

Figure 11F:
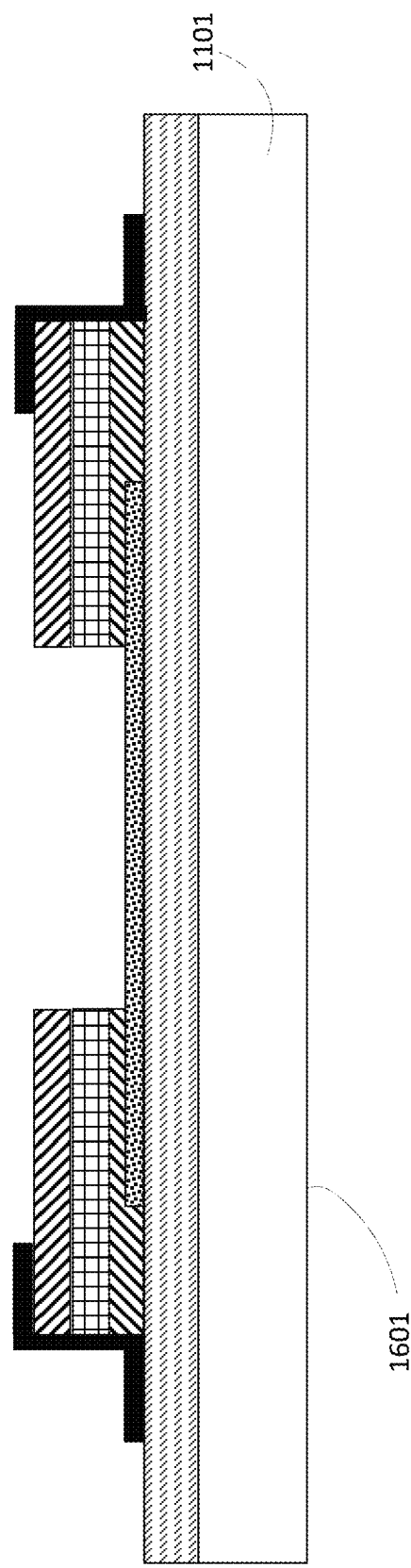
FIG. 11f is a cross-sectional view of a power monitoring device in still another step of its manufacturing process in accordance with an embodiment of the present patent application.

FIG. 11f is a cross-sectional view of a power monitoring device in still another step of its manufacturing process in accordance with an embodiment of the present patent application. Referring to FIG. 11f, backside silicon grinding is carried out at the backside 1601 of the silicon support layer 1101, so that the thickness of the silicon support layer 1101 is reduced to a certain value, for example 200 um.

Figure 11G:
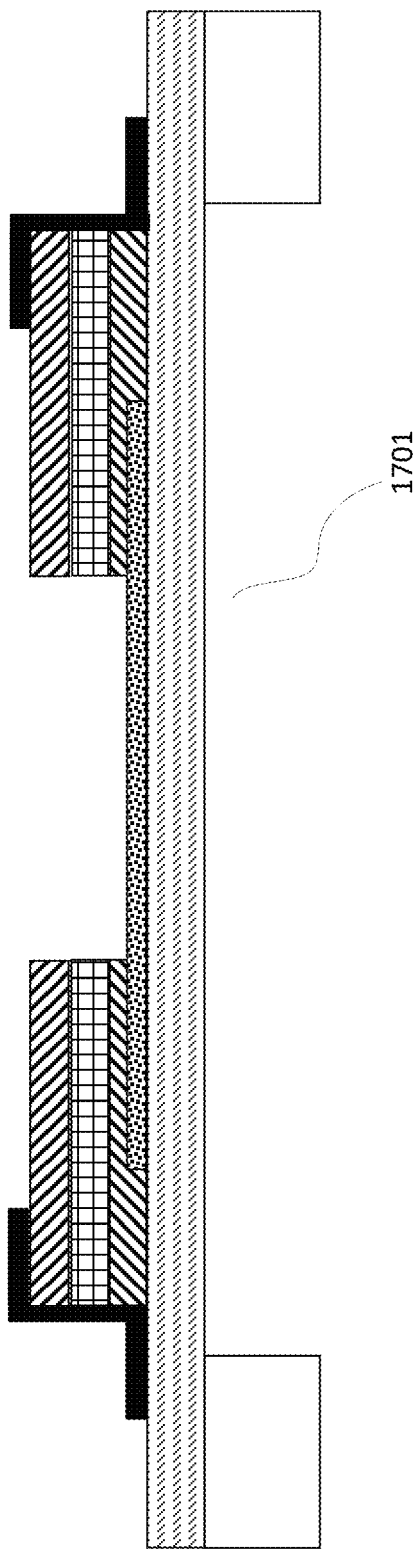
FIG. 11g is a cross-sectional view of a power monitoring device in still another step of its manufacturing process in accordance with an embodiment of the present patent application.

FIG. 11g is a cross-sectional view of a power monitoring device in still another step of its manufacturing process in accordance with an embodiment of the present patent application. Referring to FIG. 11g, a backside window 1701 is formed by DRIE.

Figure 11H:
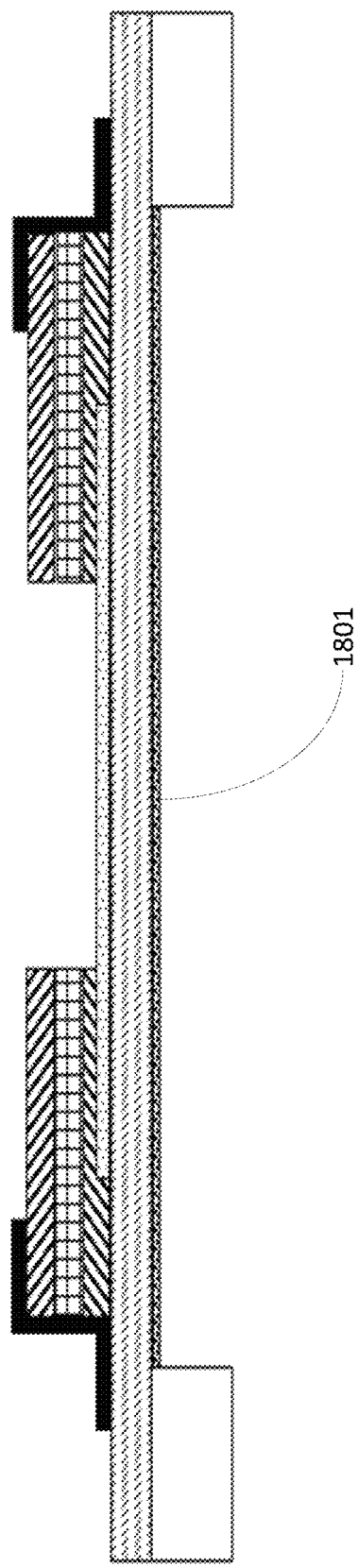
FIG. 11h is a cross-sectional view of a power monitoring device in still another step of its manufacturing process in accordance with an embodiment of the present patent application.

FIG. 11h is a cross-sectional view of a power monitoring device in still another step of its manufacturing process in accordance with an embodiment of the present patent application. Referring to FIG. 11h, an antireflection layer 1801 is deposited on the glass layer from the backside. The antireflection layer on the bottom surface of silicon wafer can be selectively removed as an optional step.

Figure 11I:
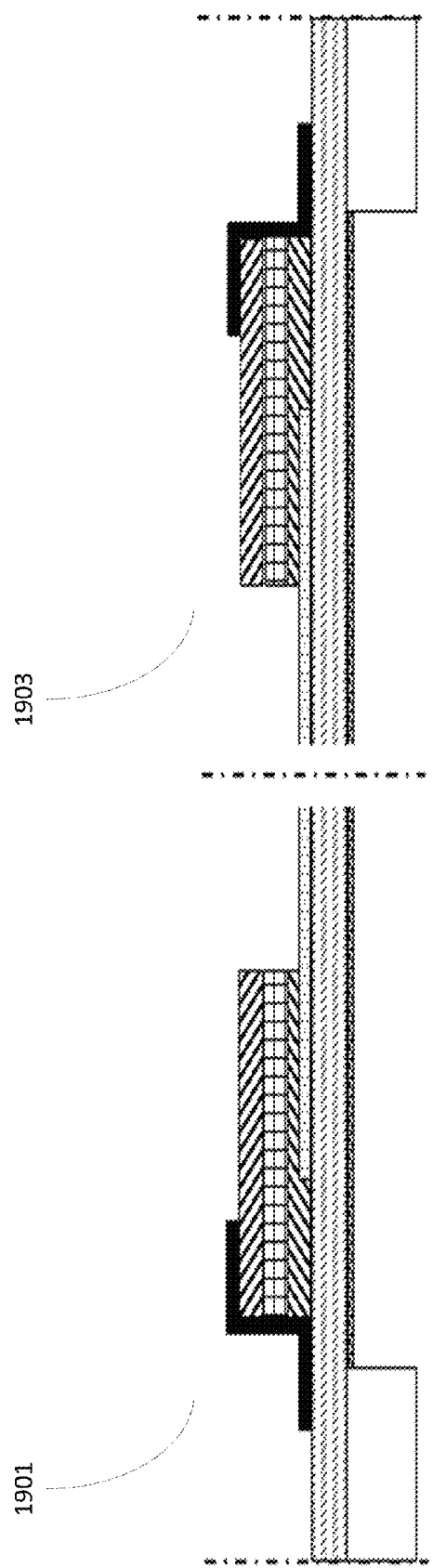
FIG. 11i is a cross-sectional view of a power monitoring device in still another step of its manufacturing process in accordance with an embodiment of the present patent application.

FIG. 11i is a cross-sectional view of a power monitoring device in still another step of its manufacturing process in accordance with an embodiment of the present patent application. Referring to FIG. 11i, dicing is performed to separate the individual power monitoring devices. Two individual power monitoring devices 1901 and 1903 are diced in just one time slice besides the normal dicing for chip separation.

Figure 11J:
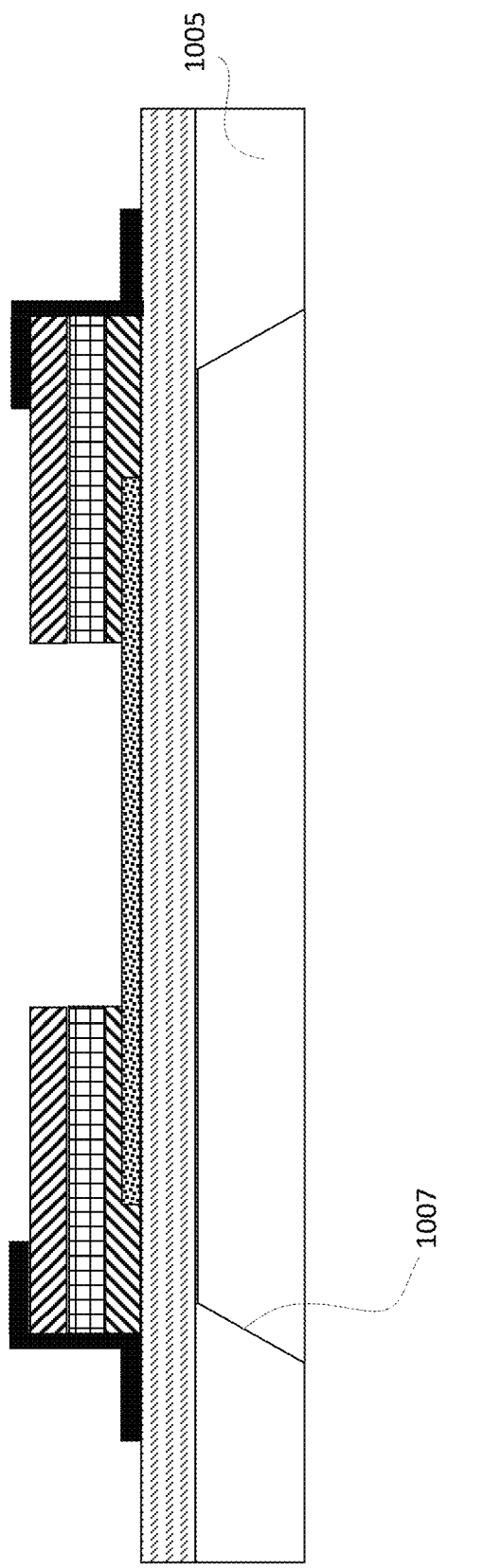
FIG. 11j is a cross-sectional view of a power monitoring device in a step of its manufacturing process in accordance with the embodiment depicted in FIG. 10.

FIG. 11j is a cross-sectional view of a power monitoring device in a step of its manufacturing process in accordance with the embodiment depicted in FIG. 10. Referring to FIG. 11j and FIG. 10, the slant side slant side wall 1007 is realized by anisotropic silicon wet etching in the silicon support layer 1005.

In the above embodiments, glass is used as sensing element substrate for its being transparent to light emitted from the VCSEL with a wavelength of 850 nm. The conductor used for electrical input is also transparent material ITO. The tailored amorphous silicon layers are designed to have small but sufficient optical absorption in the VCSEL optical wavelength range, and occupy only a partial optical distribution area. All these can ensure most of light from the VCSEL to pass through without interfering signal transmitting. The silicon with the etched cavity is a supporter to make the glass suspended on the VCSEL. This structure allows the PMD to be inserted into the gap between the VCSEL and the lens part of the transmitter. Wire bonding is used to transfer signals between the sensing element and control circuits on the PCB.

The VCSEL and the PMD device are made in different fabrication process, reducing the fabrication complexity. The main structure of the COB (chip on board) packaged transmitter needs not to be changed to contain the power monitoring device (PMD) stack. The PMD stack is attached to the same substrate (i.e. the PCB board) as the VCSEL and lens part by using the same or similar attaching method, such as adhesive, which makes the process very simple The PMD stack is batch fabricated by MEMS fabrication process, having advantages of small volume, low cost, and high throughput. During package integration, the requirement for alignment between the VCSEL and the PMD is not quite critical, which makes the assembly process easy. The monitoring activity can be calibrated before usage. The PMD is semi-transparent and pattern-like, having no interference with the VCSEL normal operation in optical communication processes.

While the present patent application has been shown and described with particular references to a number of embodiments thereof, it should be noted that various other changes or modifications may be made without departing from the scope of the present invention.

What is claimed is:

1. A transmitter comprising:
   a PCB board;
   a laser element disposed on the PCB board and attached thereto;
   a power monitoring device disposed on the PCB board above the laser element and attached to the PCB board;
   a lens part disposed on the PCB board and above the laser element and the power monitoring device;
   an IC driver disposed on the PCB board and connected with the laser element through bond wires; and
   a feedback circuit for the IC driver connected with the power monitoring device through a plurality of bond wires; wherein:
   the power monitoring device comprises a silicon support layer being attached to the PCB board, a glass layer disposed above the silicon support layer, at least one sensing element disposed on the glass layer, and at least one metal pad disposed on the glass layer;
   the sensing element is suspended over the laser element and configured for sensing light directed thereto that is emitted by the laser element; and
   the silicon support layer comprises a cavity configured for accommodating the laser element.

2. The transmitter of claim 1, wherein the laser element comprises a VCSEL or a VCSEL array.

3. The transmitter of claim 1, wherein the at least one sensing element is a PIN photodiode comprising a p-type amorphous silicon layer, an n-type amorphous silicon layer, and an intrinsic silicon layer disposed in between the p-type amorphous silicon layer and the n-type amorphous silicon layer; the transmitter further comprising a transparent electrode layer buried between the sensing element and the glass layer, and a contact electrode layer disposed on the sensing element.

4. The transmitter of claim 3, wherein the transparent electrode layer is made of ITO.

5. The transmitter of claim 1, wherein the power monitoring device further comprises an antireflection layer disposed underneath the glass layer.

6. The transmitter of claim 1, wherein the sensing element has a rectangular shape, and covers a predetermined percentage of a light distribution emitted from an aperture of the laser element.

7. The transmitter of claim 1, wherein the power monitoring device comprises a plurality of sensing elements, the sensing elements each having a rectangular shape, being distributed symmetrically or asymmetrically, and covering an edge portion of a light distribution emitted from an aperture of the laser element.

8. The transmitter of claim 1, wherein the sensing element has a ring shape, and covers an edge portion or an inner portion of a light distribution emitted from an aperture of the laser element.

9. The transmitter of claim 1, wherein the sensing element has a circular shape, and covers a center portion of a light distribution emitted from an aperture of the laser element.

10. The transmitter of claim 1, wherein a slant side wall is formed in the silicon support layer so as to define the cavity for accommodating the laser element.

11. A power monitoring device comprises:
    a silicon support layer being attached to a PCB board;
    a glass layer disposed above the silicon support layer;
    at least one sensing element disposed on the glass layer; and
    at least one metal pad disposed on the glass layer; wherein:
    the sensing element is suspended over a laser element that is attached to the PCB board and configured for sensing light directed thereto that is emitted by the laser element; and
    the silicon support layer comprises a cavity configured for accommodating the laser element.

12. The power monitoring device of claim 11, wherein the at least one sensing element is a PIN photodiode comprising a p-type amorphous silicon layer, an n-type amorphous silicon layer, and an intrinsic silicon layer disposed in between the p-type amorphous silicon layer and the n-type amorphous silicon layer; the transmitter further comprising a transparent electrode layer buried between the sensing element and the glass layer, and a contact electrode layer disposed on the sensing element.

13. The power monitoring device of claim 12, wherein the transparent electrode layer is made of ITO.

14. The power monitoring device of claim 11, wherein the power monitoring device further comprises an antireflection layer disposed underneath the glass layer.

15. The power monitoring device of claim 11, wherein the sensing element has a rectangular shape, and covers a predetermined percentage of a light distribution emitted from an aperture of the laser element.

16. The power monitoring device of claim 11, wherein the power monitoring device comprises a plurality of sensing elements, the sensing elements each having a rectangular shape, being distributed symmetrically or asymmetrically, and covering an edge portion of a light distribution emitted from an aperture of the laser element.

17. The power monitoring device of claim 11, wherein the sensing element has a ring shape, and covers an edge portion or an inner portion of a light distribution emitted from an aperture of the laser element.

18. A transmitter comprising:
    a PCB board;
    a laser element disposed on the PCB board;
    a power monitoring device disposed on the PCB board above the laser element; and
    a lens part disposed on the PCB board and above the laser element and the power monitoring device; wherein:
    the power monitoring device comprises a silicon support layer being attached to the PCB board, a glass layer disposed above the silicon support layer, at least one sensing element disposed on the glass layer, and at least one metal pad disposed on the glass layer;
    the sensing element is suspended over the laser element and configured for sensing light directed thereto that is emitted by the laser element; and
    the silicon support layer comprises a cavity configured for accommodating the laser element.

19. The transmitter of claim 18, wherein the sensing element has a circular shape, and covers a center portion of a light distribution emitted from an aperture of the laser element.

20. The transmitter of claim 18, wherein a slant side wall is formed in the silicon support layer so as to define the cavity for accommodating the laser element.

* * * * *